United States Patent
Hsueh et al.

(10) Patent No.: US 6,395,156 B1
(45) Date of Patent: May 28, 2002

(54) SPUTTERING CHAMBER WITH MOVING TABLE PRODUCING ORBITAL MOTION OF TARGET FOR IMPROVED UNIFORMITY

(75) Inventors: Paul Hsueh, Concord; Abraham C. Ma, Fremont, both of CA (US)

(73) Assignee: Super Light Wave Corp., San Jose, CA (US)

(*) Notice: Subject to any disclaimer, the term of this patent is extended or adjusted under 35 U.S.C. 154(b) by 14 days.

(21) Appl. No.: 09/681,962

(22) Filed: Jun. 29, 2001

(51) Int. Cl.[7] .............................................. C23C 14/46
(52) U.S. Cl. ............................ 204/298.04; 204/298.12; 204/298.2; 204/298.23; 204/298.27; 204/298.28; 204/298.29; 204/192.11
(58) Field of Search ........................ 204/298.04, 298.12, 204/298.2, 298.22, 298.23, 298.27, 298.28, 298.29, 192.11

(56) References Cited

U.S. PATENT DOCUMENTS

| 4,541,882 A | 9/1985 | Lassen ........................ 156/150 |
| 4,872,189 A | 10/1989 | Frankel et al. .............. 378/119 |
| 5,015,352 A | 5/1991 | Hashimoto et al. .... 204/192.15 |
| 5,213,672 A | 5/1993 | Hartig et al. .......... 204/298.22 |
| 5,382,344 A | 1/1995 | Hosokawa et al. ...... 204/298.2 |
| 5,429,732 A | 7/1995 | Dave et al. ............ 204/192.11 |
| 5,445,721 A | 8/1995 | Bower .................... 204/192.12 |
| 5,620,577 A | 4/1997 | Taylor ................... 204/298.22 |
| 5,741,404 A | 4/1998 | Cathey .................. 204/192.11 |
| 5,757,885 A | 5/1998 | Yao et al. .................... 378/130 |
| 5,985,115 A | 11/1999 | Hartsough et al. ..... 204/298.09 |
| 6,051,113 A | 4/2000 | Moslehi ................. 204/192.12 |

*Primary Examiner*—Rodney G. McDonald
(74) *Attorney, Agent, or Firm*—Stuart T. Auvinen

(57) ABSTRACT

A sputtering chamber has a target that moves with an orbital motion relative to an ion beam. An X-Y assembly allows for target movement in both the horizontal and vertical directions. The X-Y assembly has a base plate, an intermediate plate, and a target mounting plate that attaches to the target. The plates are connected together by bearing blocks that slide along rails in the X and Y directions. A rotating shaft has gears that rotate a center shaft through the base and intermediate plates. The rotating center shaft has an arm on its end that attaches to the target mounting plate. The arm produces an orbital movement of the target. Rather than simply rotating the target around the center shaft, the center of the target orbits around the center of the center shaft. Ion-beam wear is spread across the target surface, extending target life and improving deposition uniformity.

21 Claims, 12 Drawing Sheets

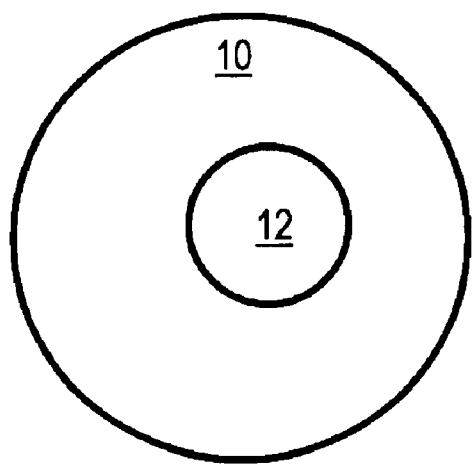 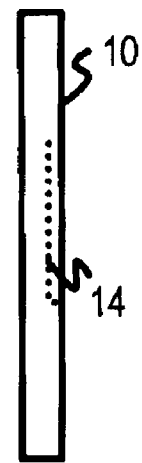
FIG. 1A  FIG. 1B
PRIOR ART
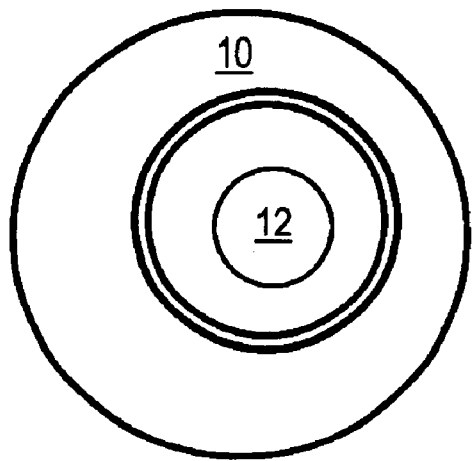 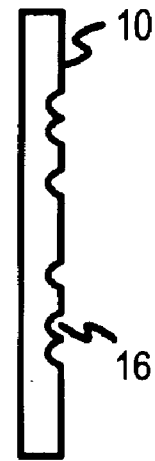
FIG. 2A  FIG. 2B
PRIOR ART

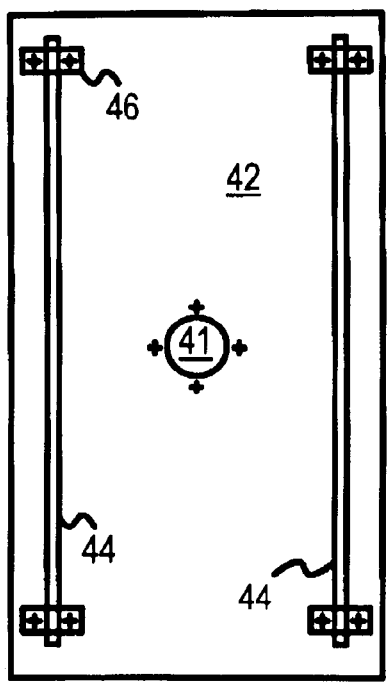
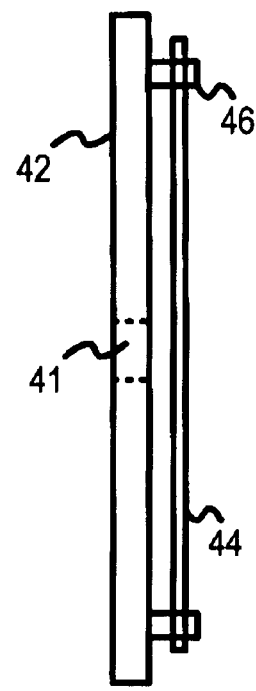
FIG. 6A  FIG. 6B
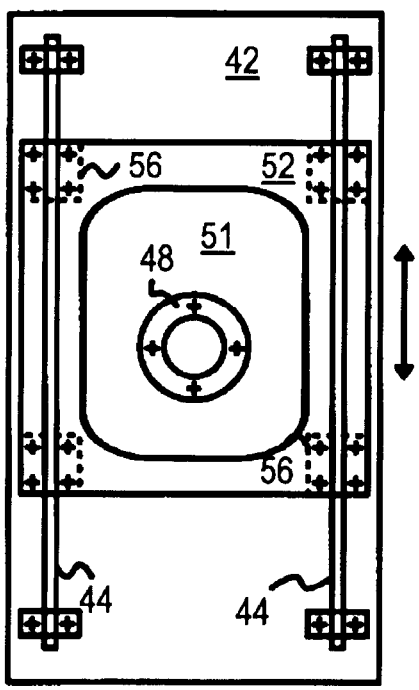
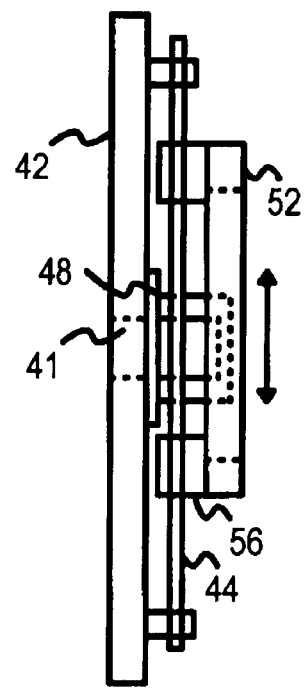
FIG. 7A  FIG. 7B

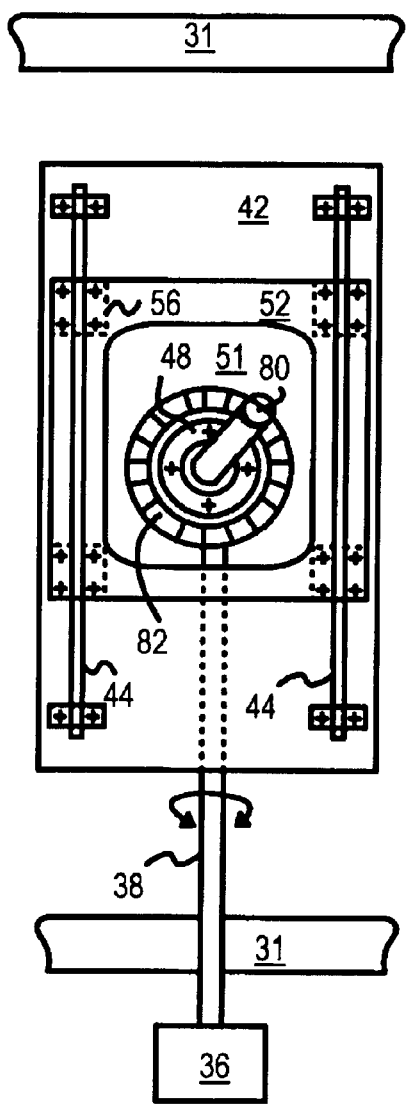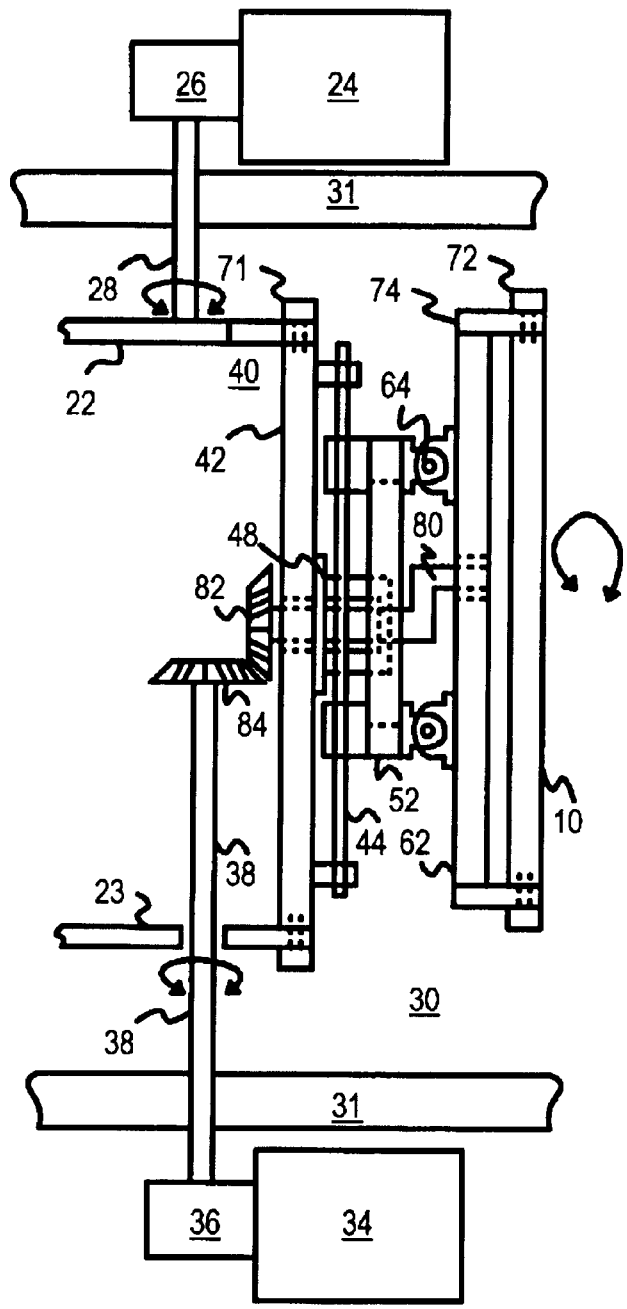
FIG. 11A
FIG. 11B

SPUTTERING CHAMBER WITH MOVING TABLE PRODUCING ORBITAL MOTION OF TARGET FOR IMPROVED UNIFORMITY

BACKGROUND OF INVENTION

This invention relates to sputtering systems, and more particularly to target movement for improved uniformity.

Thin films for electronic or optical devices can be deposited onto a substrate in a low-pressure sputtering chamber or machine. An ion-beam generator or source directs ions to the surface of a target, causing some target atoms or ions to be ejected from the target's surface. These target ions then travel through the low-pressure chamber until reaching the surface of the substrate. A thin film of the target material, or a compound form of the target material, is deposited on the surface of the substrate.

Each target can be used many times, depositing films on many substrates that are loaded and unloaded into the chamber. Eventually the target becomes worn and must be replaced with a new target. Such target replacement may halt production runs and require a skilled technician. Minimizing target replacement is desirable; however, film quality is critical so targets are often replaced frequently to improve film uniformity.

FIG. 1A is a front view of a worn sputtering target. Repeated deposition runs using the same target results in removal of target material from target 10. Spot 12 is formed on the surface of target 10 where the ion beam impacts target 10. The size and shape of spot 12 can vary with the angle of the ion beam to target 10, and the type and beam-shape of ion-beam generator used. The location of spot 12 can be off-center of target 10 as shown.

FIG. 1B is a side view of a worn sputtering target. Depression 14 is formed on target 10 where spot 12 impacted the surface of target 10. The target material that was in depression 14 was ejected by the ion beam impacting the surface of target 10 in the region of depression 14.

More complex shapes of the ion-beam spot on the target are possible. FIGS. 2A, 2B show complex wear of a sputtering target. Spot 12 has several annular rings that are caused by the ion beam being somewhat non-uniform. Regions of the ion beam with a higher beam density or energy can sputter portions of target 10 at higher rates. Dimples 16 may be formed on the surface of target 10 where the beam has a higher energy or density. Dimples 16 may be ring-shaped or somewhat irregular.

FIG. 3A shows sputtering of a new target. Ion source 18 generates an ion beam that is directed onto target 10. Target ions or atoms are ejected from target 10 and travel to the surface of substrate 20, depositing a film on substrate 20. Substrate 20 can be removed and replaced with another substrate and deposition repeated many times with many different substrates before target 10 is replaced.

FIG. 3B shows sputtering of a worn target. After many depositions runs, dimples 16 have formed on the surface of target 10 where the ion beam from ion source 18 has impacted the surface. Since the surface of target 10 is no longer smooth but rough, some scattering of the ion beam can occur. The angle that target atoms or ions are ejected can vary with the surface roughness. Some ejected target atoms may not reach the surface of substrate 20, resulting in a lower deposition rate and possibly a less-uniform deposition across the surface of substrate 20. Since such scattering is undesirable, target 10 is often replaced more frequently to avoid such problems.

Since target replacement may require downtime of the sputtering machine, spare targets are sometimes included within the sputtering chamber to minimize such downtime. Target replacement can be automated, allowing 2 or 3 targets to be used up before all targets are replaced at one time.

FIG. 4A shows a top view of a sputtering chamber with multiple targets. Target 10 is mounted on target mount 22. Spare targets 15, 17 are also mounted on target mount 22. A motor can be activated to turn shaft 28, allowing a different or spare target 15 to be rotated into the position that was occupied by target 10, so that the ion beam from ion source 18 impacts spare target 15, which deposits a film onto substrate 20.

Shaft 28 can be rotated by one-third of a revolution, or 120 degrees, to exchange targets. Spare targets 15, 17 can be of the same target material as target 10, or can be of an entirely different target material. The sputtering machine can be programmed with a recipe that rotates shaft 28 to select one of the three targets for each deposition step. Multi-layer films can then be deposited.

FIG. 4B is a side view of a sputtering chamber with multiple targets. Ion-beam source 18 sends an ion beam that impacts target 10. Target atoms or ions ejected from target 10 travel to substrate 20 and are deposited on its surface. To improve film uniformity, substrate 20 can be rotated by a motor (not shown).

Spare target 15 (an another spare target hidden from view) and selected target 10 are mounted on target mount 22. Shaft 28 can rotate target mount 22 to select the desired target for sputtering. Motor 24 and gearbox 26 are activated to rotate shaft 28 by the desired amount. Motor 24 is mounted outside the low-pressure chamber 30 to minimize contamination.

Targets 10, 15 and substrate 20 can be heated or cooled as desired. Channels for cooling water can be formed on the backing plates to targets 10, 15. Motor 24 can also be operated during deposition to slightly rock target 10. Shaft 28 rocks back and forth by about 3 degrees to slightly vary the surface angle of the ion beam to target 10 during deposition. This rocking may improve uniformity.

Although target wear may be improved by such rocking, a mechanism to move the target is desired to improve uniformity. Rotation or spinning of targets has been used as one way to improve target wear. However, such target rotation may not sufficiently spread the wear over the target surface. A more aggressive way to move the target during deposition is thus desired to reduce target wear and improve uniformity of deposition.

BRIEF DESCRIPTION OF DRAWINGS

FIG. 1A is a front view of a worn sputtering target.

FIG. 1B is a side view of a worn sputtering target.

FIGS. 2A, 2B show complex wear of a sputtering target.

FIG. 6A is a front view of the base plate in the X-Y table assembly.

FIG. 6B is a side view of the base plate and base rails.

FIG. 7A is a front view of the intermediate plate connected to the base plate by the base rails to permit Y-movement of the intermediate plate.

FIG. 7B is a side view of the intermediate plate sliding along the base rails fixed to the base plate.

FIG. 11A is a front (outside) view of the X-Y assembly inside a sputtering chamber.

FIG. 11B is a side view of the X-Y assembly inside a sputtering chamber.

DETAILED DESCRIPTION

The present invention relates to an improvement in sputtering systems. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor uses an X-Y table to move the target with an orbital motion. The orbital motion generated by the X-Y table moves the ion-beam spot across a wide area of the target. Wear is spread out over a larger area of the target, minimizing dimples and surface roughness. Targets can be used for a longer period of time before replacement, and a more uniform film can be deposited.

Figure 3A:
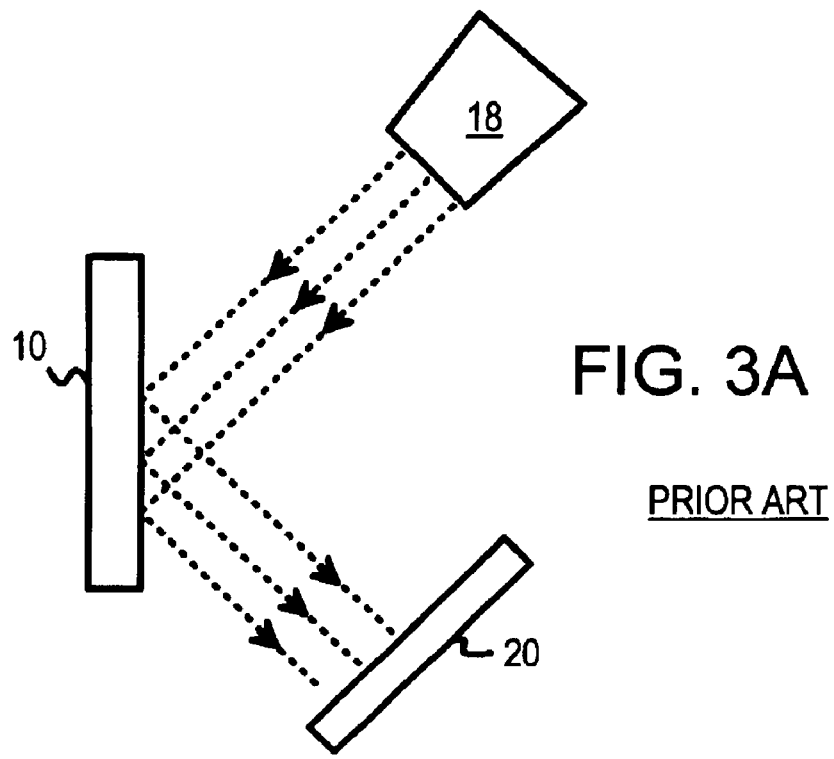
FIG. 3A shows sputtering of a new target.
Figure 3B:
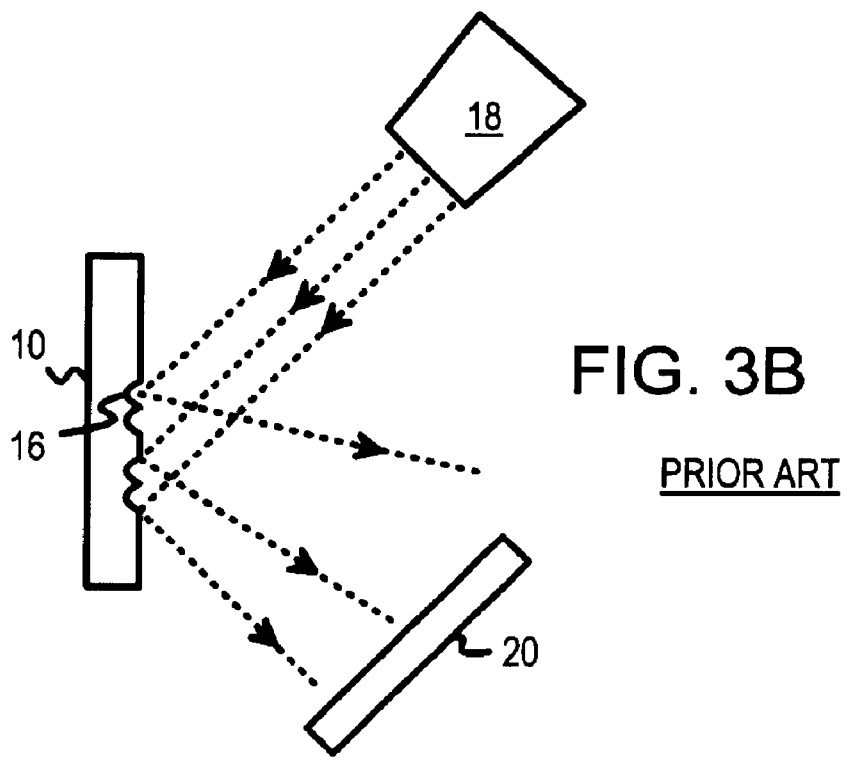
FIG. 3B shows sputtering of a worn target.
Figure 4A:
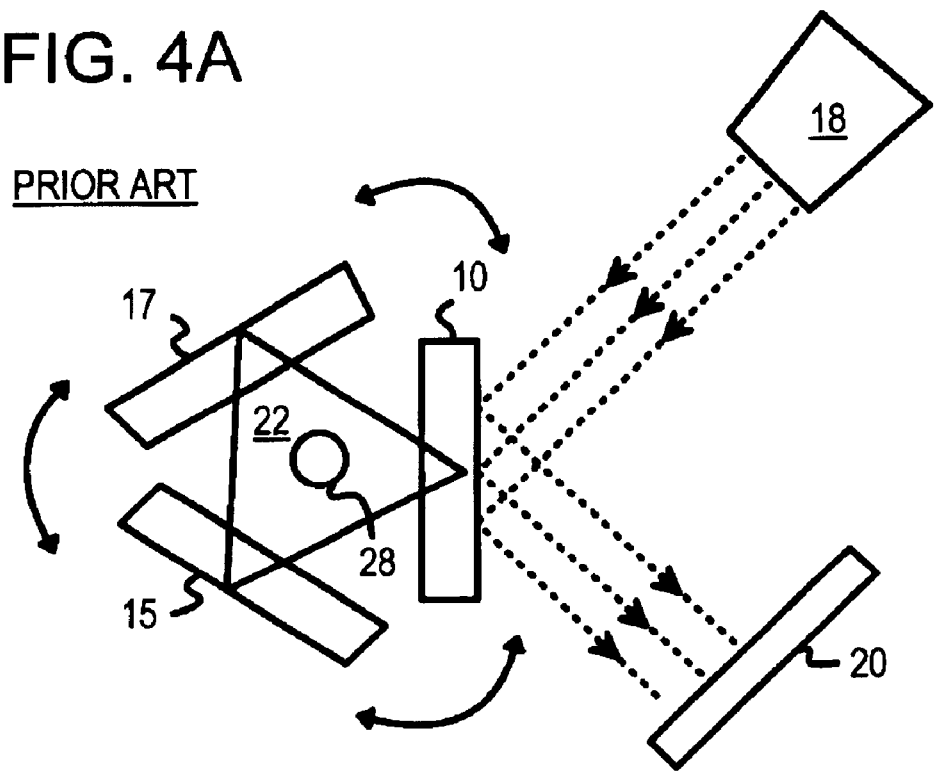
FIG. 4A shows a top view of a sputtering chamber with multiple targets.
Figure 4B:
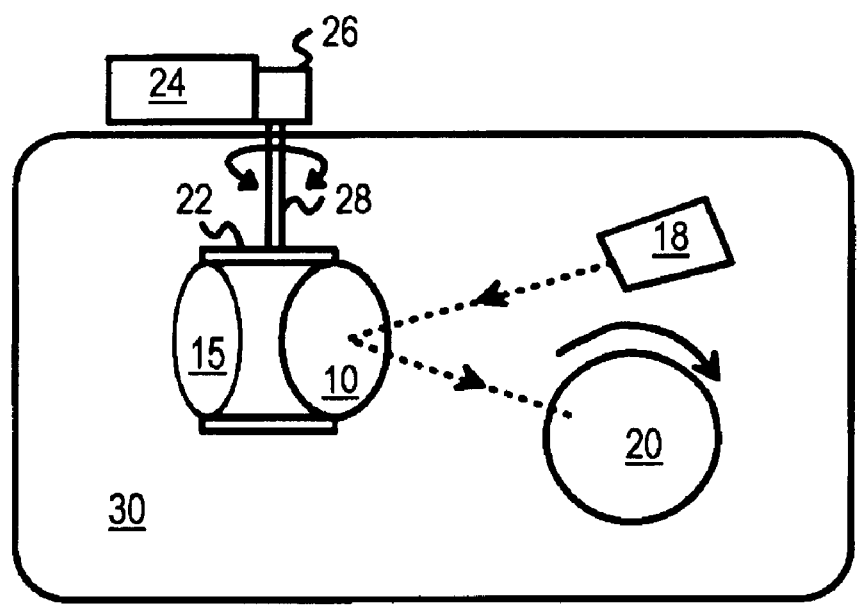
FIG. 4B is a side view of a sputtering chamber with multiple targets.
Figure 5:
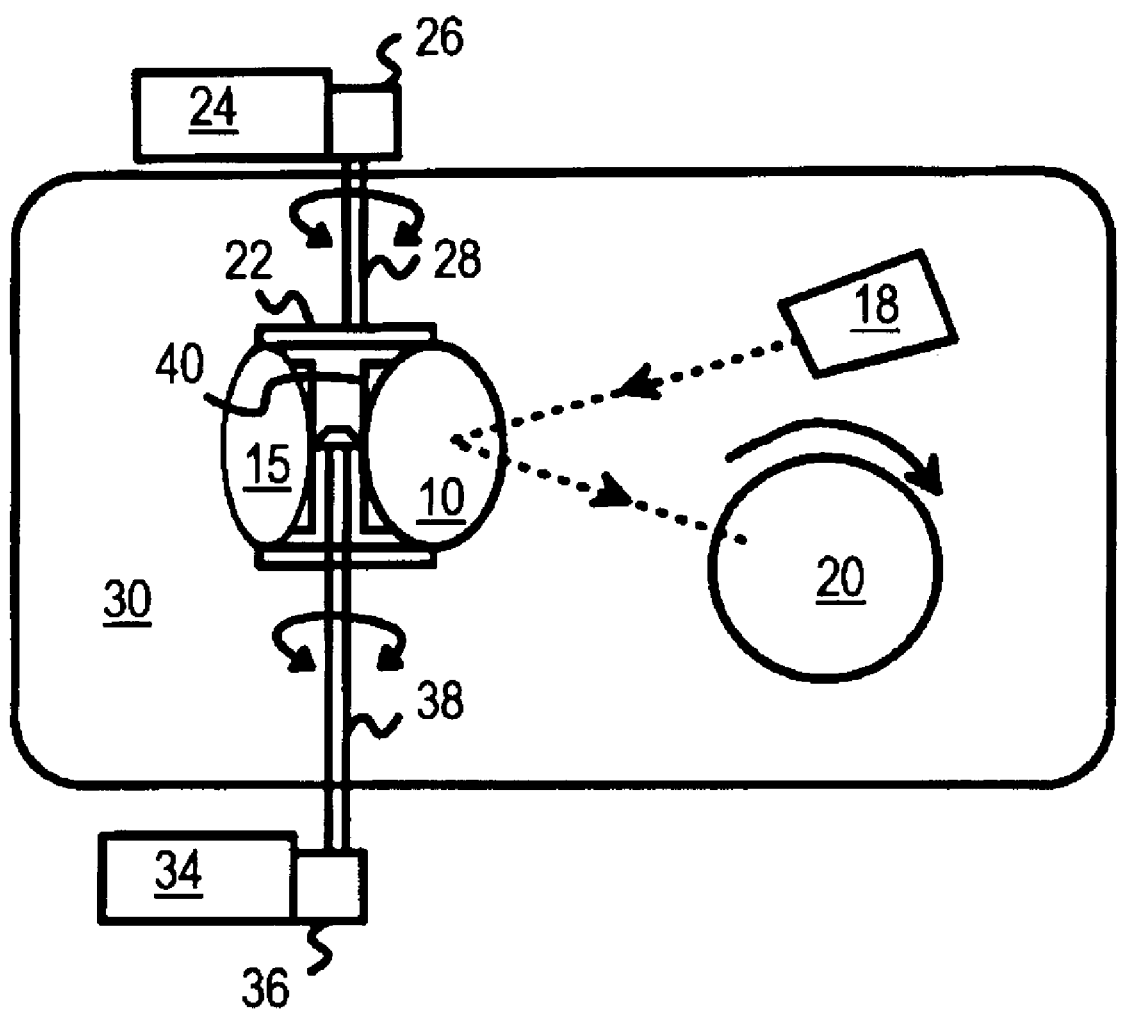
FIG. 5 shows a multi-target sputtering chamber with an additional motor to move the target with an orbital motion.

FIG. 5 shows a multi-target sputtering chamber with an additional motor to move the target with an orbital motion. Chamber 30 is a low-pressure sputtering chamber that directs an ion beam from ion-beam source 18 to target 10. Ions or atoms ejected from target 10 are deposited onto the surface of substrate 20. Substrate 20 is rotated during deposition by a motor.

Spare target 15 can be rotated into position under ion-beam source 18 in place of target 10 when target 10 is worn, or when a different kind of target material is desired. A third spare target (not shown) is also supported by target mount 22 and can also be rotated into position. Gearbox 26 reduces the rotational motion of motor 24 to move shaft 28 by one-third a revolution to select the next spare target 15. Additional targets could be mounted on a larger target mount 22 and a smaller rotational movement used to select from among additional targets.

X-Y assembly 40 holds target 10 and attaches target 10 to target mount 22. X-Y assembly 40 is powered by shaft 38 to produce an X and Y motions of target 10 during deposition. The X and Y motion produces an orbital movement of target 10 with respect to the ion beam. This orbital motion evens wear of target 10. Additional X-Y assemblies can be used to attach spare target 15 and other spare targets to target mount 22.

All of the X-Y assemblies 40 are powered by shaft 38 through a gear in the center of target mount 22. Shaft 38 is rotated by motor 34. The rotational speed of motor 34 can be adjusted by optional gearbox 36 and the speed of motor 34.

During deposition, lower shaft 38 is rotated, but upper shaft 28 is not. After deposition, when a different target is selected, upper shaft 28 is rotated until the desired spare target 15 is in position. Lower shaft 38 can be stopped after deposition is complete. Motor 34 can be activated when ion-beam source 18 is on, so that lower shaft 38 is rotated during deposition. Lower shaft 38 can be rotated at 5 revolutions per minute, or at another rate.

The substantially complete X-Y assembly 40 is shown in FIGS. 11A, B. Various parts and subsets of X-Y assembly 40 are shown in FIGS. 6A to 10B.

FIG. 6A is a front view of the base plate in the X-Y table assembly. Base plate 42 is attached to the target mount and does not move except when the upper shaft is rotated to select a different spare target. Base plate 42 can thus be considered a stationary reference plate for the X-Y assembly.

Hole 41 is provided near the middle of base plate 42. Hole 41 permits a rotating center shaft to pass through base plate 42. This rotating center shaft powers the orbital motion of the target attached to the X-Y assembly supported by base plate 42.

Base rails 44 are round or other cross-sectional rods. Each rail 44 is attached to base plate 42 by brackets 46 at each end of each base rail 44. Base rails 44 permit vertical (Y-direction) movement of the intermediate plate. FIG. 6B is a side view of the base plate and base rails. Brackets 46 attach base rails 44 to base plate 42. Hole 41 is an opening near the center of base plate 42.

FIG. 7A is a front view of the intermediate plate connected to the base plate by the base rails to permit Y-movement of the intermediate plate. Intermediate plate 52 has bearing blocks 56 in each corner. Bearing blocks 56 slide along base rails 44, allowing intermediate plate 52 to slide up and down base rails 44, which are fixed to base plate 42.

FIG. 7B is a side view of the intermediate plate sliding along the base rails fixed to the base plate. Base rails 44 are fixedly mounted to base plate 42. Bearing blocks 56 are fixed to intermediate plate 52, but slide along base rails 44. Bearing blocks 56 can use small ball bearings to permit easy motion, or can use Teflon or other materials to reduce resistance to movement.

Flange 48 is mounted onto base plate 42 using four mounting bolts or other fasteners. These fasteners fit into four small mounting holes around hole 41 in base plate 42. Flange 48 extends the cylindrical opening of hole 42 above the surface of base plate 42. Flange 48 extends the sides of hole 41 up through opening 51 in intermediate plate 52. Opening 51 is elongated in shape to allow for extended movement of intermediate plate 52 before flange 48 would strike the side of opening 51 in intermediate plate 52. Flange 48 can take on several shapes or could be deleted or integrated with base plate 42.

Figure 8A:
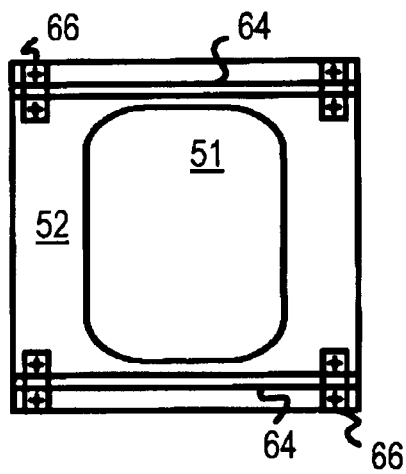
FIG. 8A shows a front view of the intermediate plate with the intermediate rods attached.

FIG. 8A shows a front view of the intermediate plate with the intermediate rods attached. The bearing blocks are attached to the back surface of intermediate plate 52 and are not shown in FIGS. 8A, B, 9A, B, and 10 A, B for clarity, but are shown later in FIGS. 1A, B.

Intermediate rails 64 are fixed to intermediate plate 52 by brackets 66 at each end. Intermediate rails 64 permit movement of the target mounting plate in the X-direction. Opening 51 in intermediate plate 52 allows for a center shaft and arm to pass through intermediate plate 52 to move the target in an orbital motion.

Figure 8B:
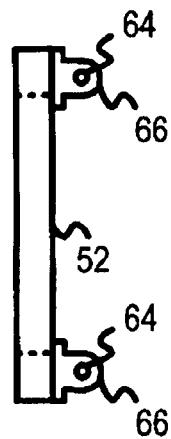
FIG. 8B is a side view of the intermediate plate and the intermediate rails.

FIG. 8B is a side view of the intermediate plate and the intermediate rails. Intermediate rails 64 are round or other cross-sectional rods attached to the front (right) surface of intermediate plate 52 by brackets 66. Intermediate rails 64 permit X-directional movement of the target. The bearing blocks (not shown) are attached to the rear (left) surface of intermediate plate 52 and permit Y-directional movement of intermediate plate 52. Thus both X- and Y-directional movement are provided by the rails.

Figure 9A:
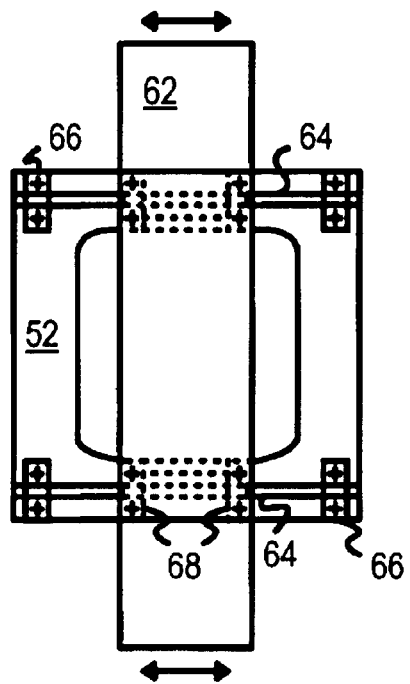
FIG. 9A is a front view of the target mounting plate moving in the X direction along the intermediate rails attached to the intermediate plate.

FIG. 9A is a front view of the target mounting plate moving in the X direction along the intermediate rails attached to the intermediate plate. Target mounting plate 62 is slidingly attached to intermediate plate 52. Bearing blocks 68 are fixedly attached to target mounting plate 62 and slide along intermediate rails 64, which are fixed to intermediate plate 52 by brackets 66. Bearing blocks 68 permit target mounting plate 62 to roll or slide along intermediate rails 64 in the horizontal (X) direction relative to intermediate plate 52.

Figure 9B:
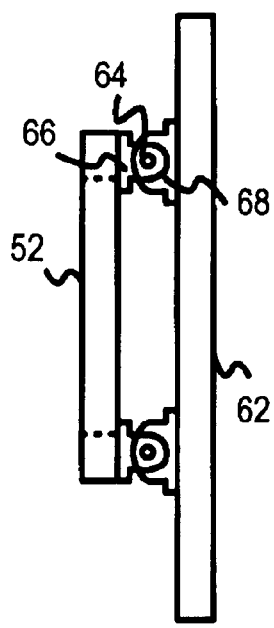
FIG. 9B is a side view of the target mounting plate that slides in the X direction relative to the intermediate plate.

FIG. 9B is a side view of the target mounting plate that slides in the X direction relative to the intermediate plate. Bearing blocks 68 are attached to the rear surface of target mounting plate 62 and slide along intermediate rails 64. Intermediate rails 64 are attached to the front surface of intermediate plate 52 by brackets 66. An opening in intermediate plate 52 permits a center shaft and arm (not shown) to pass through to attach to target mounting plate 62.

Figure 10A:
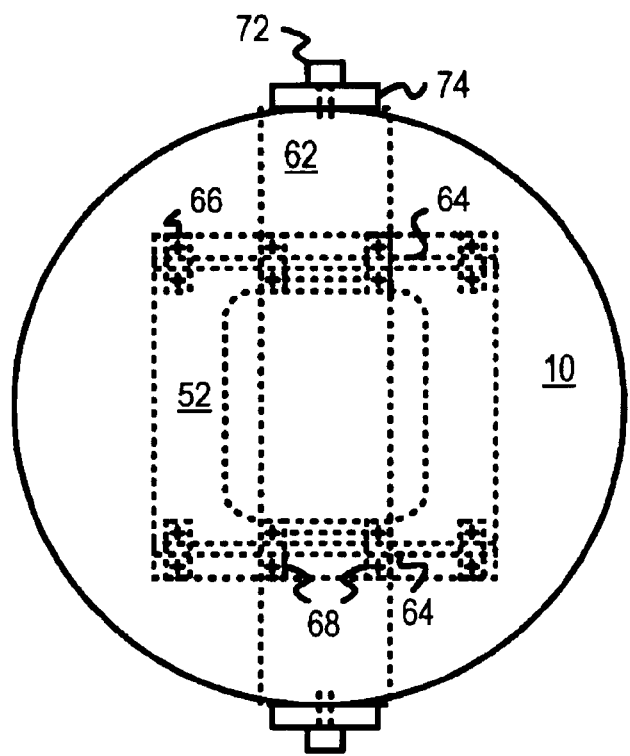
FIG. 10A is a front view of a target mounted onto the target mounting plate with the intermediate plate.

FIG. 10A is a front view of a target mounted onto the target mounting plate with the intermediate plate. Target 10 is a sputtering target that is removably attached to target mounting plate 62 by thumb screws 72. Thumb screws 72 pass through an opening or drilled hole in ends 74 to hold the edges of target 10. The opening in ends 74 can be threaded, and the target can also have a threaded hole to accept the end of thumb screws 72. Thumb screws can also hold target 10 by pressure or clamping.

Figure 10B:
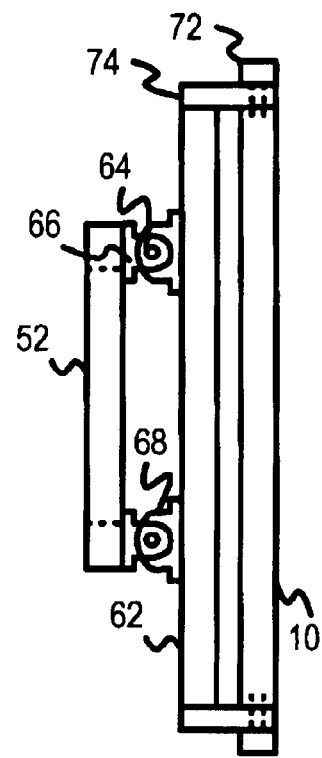
FIG. 10B is a side view of a target mounted onto the target mounting plate with the intermediate plate also shown.
Figure 12A:
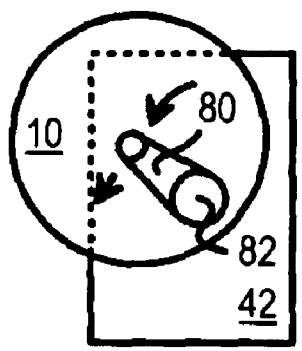
FIGS. 12A–F illustrate the orbital motion of the target, with respect to the X-Y assembly and base plate.
Figure 12F:
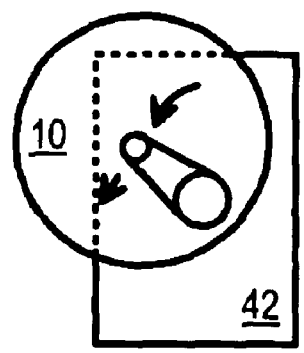
Figure 12B:
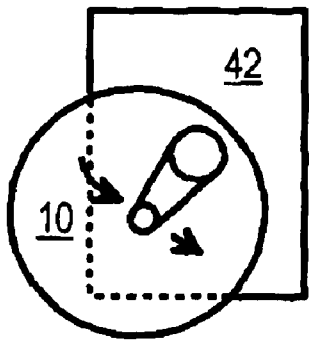
Figure 12E:
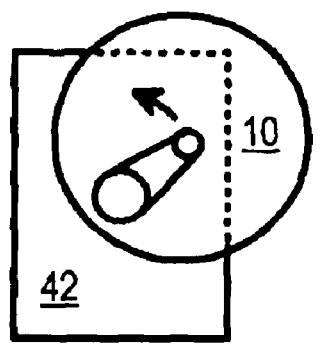
Figure 12C:
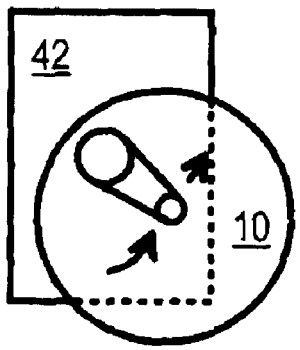
Figure 12D:
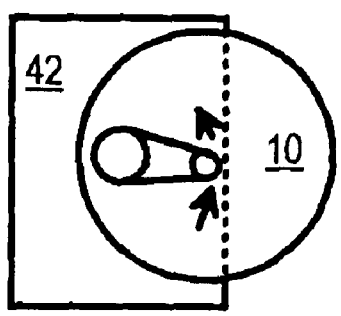
Figure 13A:
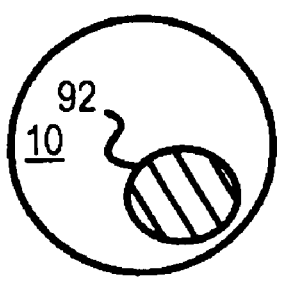
FIGS. 13A–F illustrate the orbital motion of the ion-beam spot on the target, from the point-of-view of a stationary target.
Figure 13F:
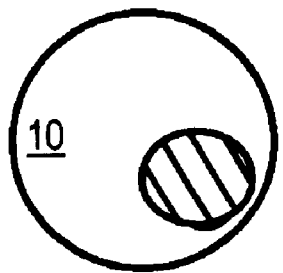
Figure 13B:
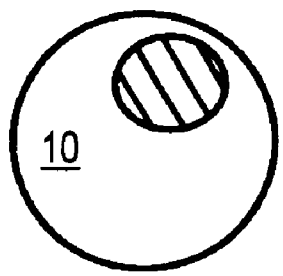
Figure 13E:
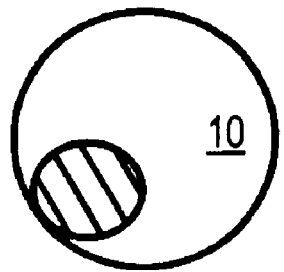
Figure 13C:
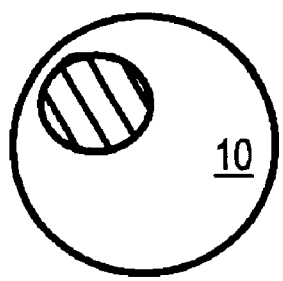
Figure 13D:
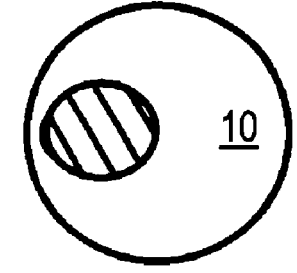

From the front view, target 10 obstructs target mounting plate 62 and intermediate plate 52, which are connected by intermediate rails 64 and bearing blocks 68. FIG. 10B is a side view of a target mounted onto the target mounting plate with the intermediate plate also shown. The ion beam impacts the front (right) surface of target 10, causing target ions or atoms to be ejected for deposition onto the substrate (not shown). This front surface of target 10 becomes worn with use, with dimples and other surface roughness being created by sputtering. However, the orbital motion of target 10 caused by the X-Y assembly spreads this wear across a larger area of the surface of target 10, resulting in a longer-wearing surface.

Target 10 is held in place by thumb screws 72, which pass through ends 74. Ends 74 are formed on the top and bottom of target mounting plate 62, or are attached to it. Target mounting plate 62 moves in the X direction (perpendicular to the plane of the page of FIG. 10B) along intermediate rails 64 using bearing blocks 68. Brackets 66 connect intermediate rails 64 to intermediate plate 52.

FIG. 11A is a front (outside) view of the X-Y assembly inside a sputtering chamber. Shown are base plate 42 and intermediate plate 52, which slides vertically along base rails 44 using bearing blocks 56. Not shown is target mounting plate 62, which slides horizontally along intermediate rails 64. The large opening 51 in intermediate plate 52 allows for extended movement.

The hole in the middle of base plate 42 has flange 48 mounted around it. A cylindrical opening through the middle of flange 48 fits a round axle rod or center shaft 82, which is attached to arm 80 and to a gear. The gear is trapezoidal in cross-section and has teeth and grooves that engage grooves and teeth in center gear 84 that is attached to lower shaft 38.

Lower shaft 38 is rotated during deposition by motor 34, which drives shaft 38 through gearbox 36. A low-pressure or vacuum seal (not shown) can be placed around lower shaft 38 where it passes through chamber wall 31.

Activation of motor 34 causes lower shaft 38 to rotate. Center gear 84 attached to the upper end of lower shaft 38 also rotates. The teeth engaging center gear 84 cause rotation of the gear attached to center shaft 82. The rotation is effectively transformed by 90 degrees by the interlocking gears. Rotation of the gear attached to the end of center shaft 82 causes rotation of center shaft 82 within flange 48. Arm 80 attached to the far (front) end of center shaft 82 also rotates around center shaft 82. This rotation of arm 80 is linked to target mounting plate 62 to rotate target 10 with the orbital motion.

FIG. 11B is a side view of the X-Y assembly inside a sputtering chamber. The ion beam hits the front (right) side of target 10, which is held on target mounting plate 62 by thumb screws 72 through ends 74. Bearing blocks allow target mounting plate 62 to slide in the X direction (normal to the plane of the drawing) along intermediate rails 64. Intermediate rails 64 are fixed to intermediate plate 52 by brackets.

Intermediate plate 52 slides in the Y direction (up and down) using attached bearing blocks that slide along base rails 44. Base rails 44 are attached to base plate 42 by brackets. Fastener 71 attaches base plate 42 to target mount 22, or another attachment method can be substituted. Base plate 42 could even be an integral part of target mount 22.

X-Y assembly 40 is one of three such assemblies attached to target mount 22. Each spare target can have an X-Y assembly that has a gear that engages center gear 84. This moves all targets in the orbital motion at the same time, even though only one of the targets is being sputtered. Of course, the spare targets could be attached directly to target mount 22 or to a fixed target mounting plate without X-Y assemblies. The number of targets attached to target mount 22 could also be modified or vary. Only one X-Y assembly 40 for one target 10 is shown.

Motor 24 rotates upper shaft 28 through gearbox 26 to select the desired target. Rotation of upper shaft 28 rotates target mount 22 and thus the targets and X-Y assemblies into the desired position within the chamber. A vacuum seal (not shown) can also be provided where upper shaft 28 passes through chamber wall 31. Note that rotation of upper shaft 28 is independent of rotation of lower shaft 38. Ordinarily, only one of the shafts is rotated at a time: upper shaft 28 is rotated before deposition to select the target, while lower shaft 38 is rotated during deposition to even wear of the target.

The orbital motion of target 10 and target mounting plate 62 is driven by arm 80, which attached to target mounting plate 62. A bearing or rotating coupling (not shown) can be placed near the middle of target mounting plate 62 to allow arm 80 to rotate relative to target mounting plate 62. Arm 80 is attached to center shaft 82 that passes through flange 48 and the openings in base plate 42 and intermediate plate 52.

Rotation of lower shaft 38 by motor 34 causes center gear 84 to rotate, engaging the gear attached to center shaft 82. Any other gears for other target's X-Y assemblies can also be engaged and rotated at the same time by center gear 84. Rotation of center shaft 82 causes arm 80 to rotate about center shaft 82. Arm 80 pulls target mounting plate 62 along with it, causing it to slide along intermediate rails 64 and base rails 44 to accommodate the orbital motion of the end of arm 80.

Rather than simply rotating or spinning target 10 around center shaft 82, arm 80 produces an orbital motion that better spreads wear around the surface of target 10. The ion beam may hit the target at an angle, causing the beam intensity to vary with the radius of the target. Orbital, rather than circular, motion has more options to even wear. Target 10 rotates around the end of arm 80, which itself orbits around center shaft 82. Two centers of rotation produce a more complex motion that better spreads out wear. Also, the X-Y assembly can be added to existing chambers with minimal changes. The ion-beam source and substrate do not have to be moved.

FIGS. 12A–F illustrate the orbital motion of the target, with respect to the X-Y assembly and base plate. Base plate 42 of the X-Y assembly remains stationary once the desired target is selected by rotation of the upper shaft. The ion beam and base plate 42 remain in a fixed positions relative to one another once the target is selected.

Rotation of the lower shaft during deposition is driven by motor 34 and gearbox 36 to produce rotary movement of center shaft 82. As center shaft 82 rotates, arm 80 rotates about center shaft 82 of base plate 42. Target 10 is attached to the target mounting plate, which is moved by arm 80. Thus as center shaft 82 rotates, arm 80 causes target 10 to orbit center shaft 82.

Target 10 orbits around center shaft 82 of base plate 42. The ion beam is directed at a fixed location of the X-Y assembly or base plate, so orbital motion of target 10 results in the ion beam being scanned across the surface of target 10 in an orbital fashion.

FIGS. 13A–F illustrate the orbital motion of the ion-beam spot on the target, from the point-of-view of a stationary target. The target is moved in an orbital fashion by the X-Y assembly. The ion beam is in a fixed position relative to the X-Y assembly. However, for purposes of illustration, the reference for FIGS. 13A–F is from that of the target.

Ion beam spot 92 is scanned across or appears to move across the surface of target 10 in an orbital fashion. Ion beam spot 92 appears moves in a counter-clockwise orbit around the center of target 10. Wear from the ion beam is spread across a large portion of the surface of target 10. This reduces surface roughness and beam scattering, and can allow target 10 to be used for a longer period of time before replacement.

The exact position of ion-beam spot 92 on target 10 can vary with the positioning of target 10 in relation to the ion beam. The shape of ion beam spot 92 can likewise vary. Regardless of the complexity of the shape of ion-beam spot 92, target wear is reduced since the spot is orbited around the surface of target 10.

ALTERNATE EMBODIMENTS

Figures 14A, 14B:
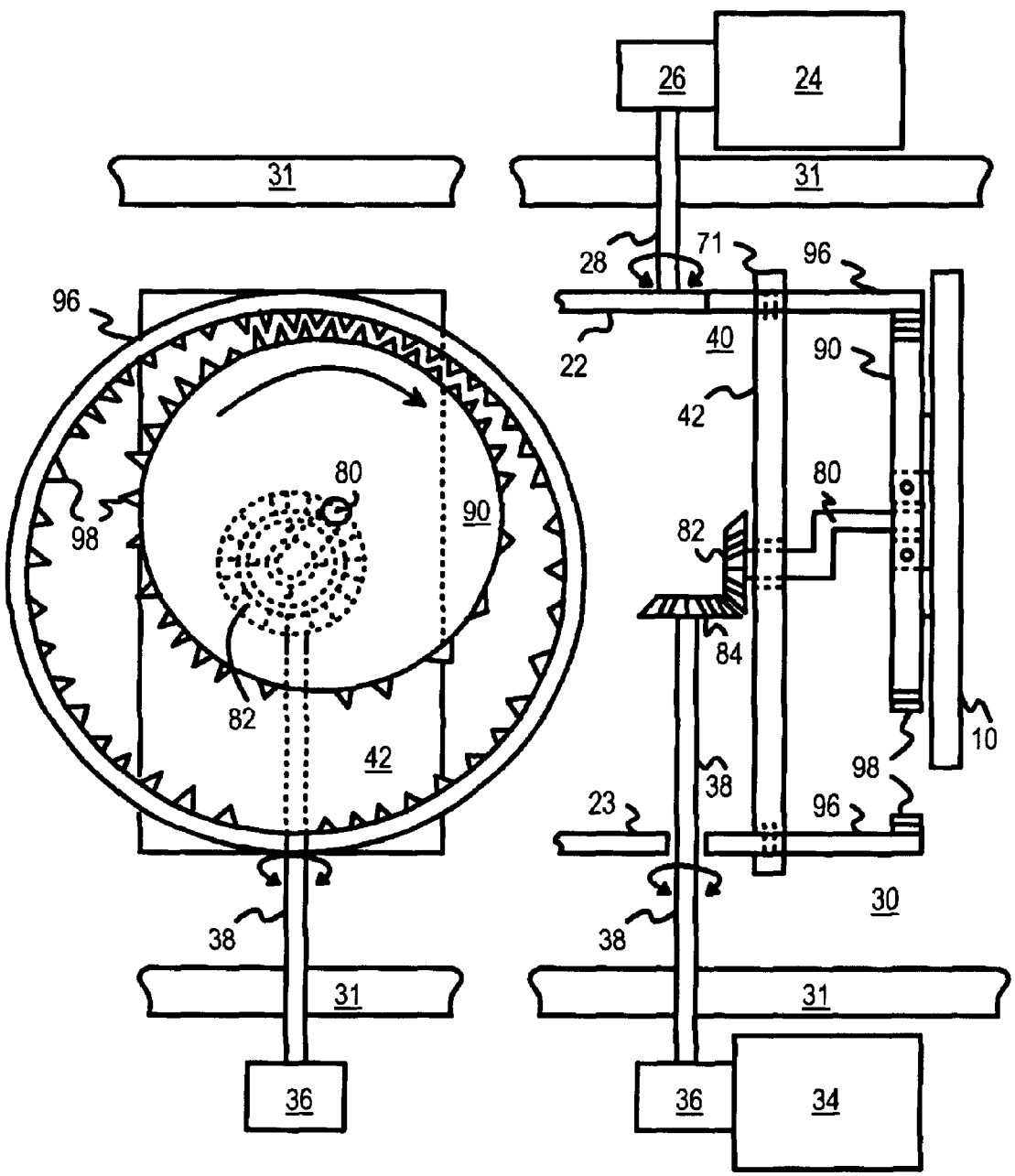
FIG. 14A–B show an alternate embodiment using interlocking gears rather than rail sliders.

Several other embodiments are contemplated by the inventors. FIGS. 14A–B show an alternate embodiment using interlocking gears rather than rail sliders. The intermediate plate and the rails are replaced by an equivalent of ringed gears. Outside ring 96 has gear teeth 98 along its inside that make contact with teeth 98 around the outside of gear 90. Gear 90 rotates within outside ring 96, engaged by teeth 98.

Outside ring 96 is attached to base plate 42, while gear 90 is attached to target 10. Thus movement of gear 90 causes target 10 to move in an orbital motion with an additional spinning motion. Arm 80 rotates when center gear 82 is rotated by motor 36 during deposition. A bearing allows arm 80 to rotate about the center connection to target mounting gear 90. Rotation of motor 36, lower shaft 38, center gear 82, and arm 80 causes gear 90 to rotate in an orbital motion within outside ring 96. Thus target 10 is moved in a spinning, orbital motion.

Figures 15A, 15B:
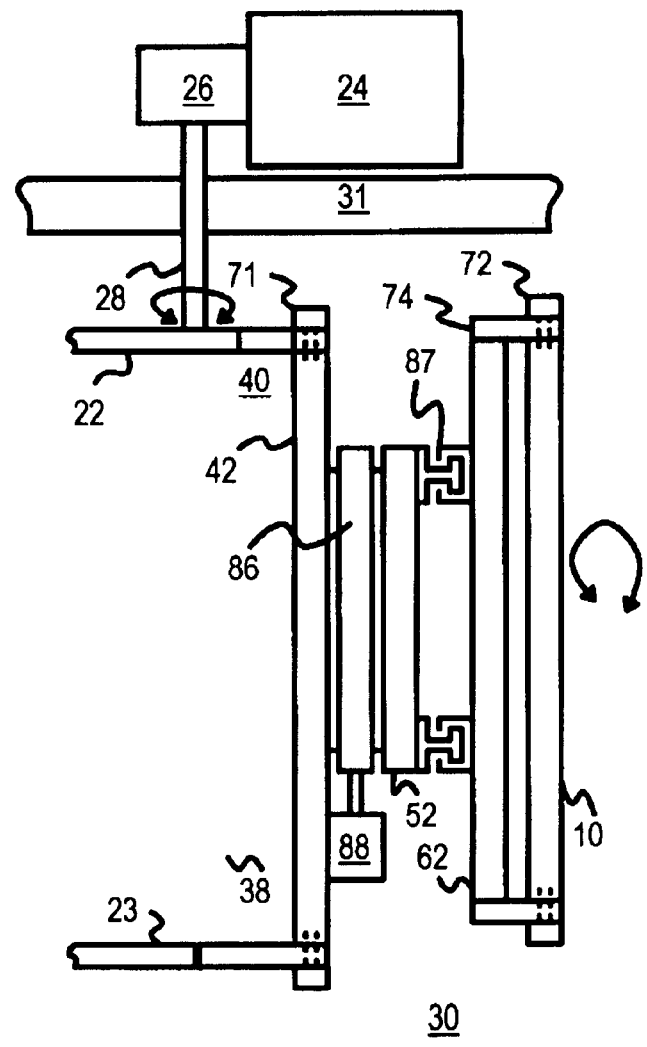
FIGS. 15A–B show an alternate embodiment using motorized slides on the plates.

FIGS. 15A–B show an alternate embodiment using motorized slides on the plates. Rather than using rails and bearings, motorized slides can be used to move the target in an orbital motion. Base motors 88 are mounted on base plate 42 and drive pistons in slides 86 to move intermediate plate 52 in a vertical direction. Other motors (not shown) mounted on intermediate plate 52 move target mounting plate 62 along slides 87 in a horizontal direction. Since the motors are mounted on the plates, the lower shaft to an external motor is not needed. The center gear, center shaft, and arm are also unnecessary using the motors mounted inside chamber 30. Of course, the motors could be mounted on the opposite plates.

The target mounting plate could be larger and of different shapes so that additional thumb screws can be held to attach to the target at additional points around its perimeter. The target could also be mounted by clamps or grooves, and could be held to the plate surface of the target mounting plate rather than spaced from it. Springs can be added to the thumb screws, or other fastening, clamping, or holding mechanisms can be substituted. The bearing blocks and rails can be replaced with other mechanisms that allow for movement of the intermediate and target mounting plates. The bearing blocks could be fixed to the other plates with the rails fixed to the intermediate and target mounting plates. Both rails could be fixed to the intermediate plate, or both bearing blocks could be fixed to the intermediate plate.

While interlocking gears have been described, other linkages can be substituted. The lower shaft that powers the orbital movement of the target can be replaced with shafts coming from other directions, or with a motor within the chamber. Selectable linkages or gears could allow a single shaft, such as the upper shaft, to sometimes rotate the target mount to select the target, while at other times engage the gears that drive the orbital motion. Additional degrees of motion could be added, such as by adding a second arm.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A mounting assembly for holding a sputtering target comprising:
   a base plate that has a stationary position relative to an ion beam during sputtering of a target to release target atoms or ions for deposition on a substrate;
   an intermediate plate, coupled to move relative to the base plate in a first direction;
   a target mounting plate, coupled to move relative to the intermediate plate in a second direction, the target mounting plate for holding the target;
   a linkage coupled to move the target mounting plate and the intermediate plate relative to the base plate and the ion beam during sputtering;
   a motor for driving the linkage during sputtering to move the target on the target mounting plate and the intermediate plate target relative to the ion beam during sputtering,
   whereby the target is moved relative to the ion beam during sputtering using the intermediate plate and target mounting plate.

2. The mounting assembly of claim 1 wherein the linkage comprises an arm and a rotating shaft, the motor linked to rotate the rotating shaft and move the arm in an orbital motion around the rotating shaft;
   wherein the arm is connected to the target mounting plate to move the target in an orbital motion wherein a center of the target orbits around the rotating shaft to distribute wear from the ion beam across a surface of the target,
   whereby target wear is spread across the surface by the orbital motion.

3. The mounting assembly of claim 2 wherein the base plate has an opening to allow the rotating shaft to pass through the base plate without moving the base plate;
   wherein the intermediate plate has an opening to allow the rotating shaft to pass through the intermediate plate without directly moving the intermediate plate.

4. The mounting assembly of claim 3 wherein the intermediate plate is moved by the target mounting plate that is linked to the rotating shaft through the arm,
   whereby the intermediate plate is indirectly moved by the target mounting plate, but the target mounting plate is directly moved by the arm.

5. The mounting assembly of claim 4 wherein the motor is outside of a chamber containing the target and a substrate; further comprising:
   a wall shaft that passes through a chamber wall but is rotated by the motor;
   a gear linkage for coupling the wall shaft to the rotating shaft, the gear linkage transferring rotation of the wall shaft to rotation of the rotating shaft.

6. The mounting assembly of claim 5 wherein the wall shaft is perpendicular to the rotating shaft,
   whereby the gear linkage transfers an axis of rotation.

7. The mounting assembly of claim 1 wherein the first direction is perpendicular to the second direction,
   wherein the intermediate plate moves relative to the base plate in a direction perpendicular to a direction of movement of the target mounting plate relative to the intermediate plate,
   whereby the target moves along two directions of movement.

8. The mounting assembly of claim 7 wherein the first direction is a vertical direction and the second direction is a horizontal direction.

9. The mounting assembly of claim 8 further comprising:
   base rails, fixed to the base plate, for allowing movement of the intermediate plate in the first direction;
   intermediate rails, fixed to the intermediate plate, for allowing movement of the target mounting plate relative to the intermediate plate in the second direction.

10. The mounting assembly of claim 9 further comprising:
    first bearing blocks, fixed to the intermediate plate and slidingly coupled to the base rails, for sliding the intermediate plate along the base rails in the first direction;
    second bearing blocks, fixed to the target mounting plate and slidingly coupled to the intermediate rails, for sliding the target mounting plate along the intermediate rails in the second direction.

11. The mounting assembly of claim 7 further comprising:
    a second motor for rotating a second shaft before sputtering to select a target from among a plurality of targets mounted on the target assembly.

12. A sputtering system for distributing target wear comprising:
    a chamber;
    a substrate in the chamber;
    a target containing atoms for deposition on a surface of the substrate;
    an ion-beam source for generating an ion beam directed at the target in the chamber, the ion beam striking the target primarily in a beam-spot on a target surface of the target;
    a target mount, inside the chamber, for holding at least one target, the target mount having at least one moving table for moving the target in an orbital motion wherein a center of the target is rotated about an orbital center that is offset from the center of the target; and
    a wear-distributing motor, coupled to the moving table of the target mount, for powering the orbital motion of the target during deposition of material from the target on the substrate;
    wherein the beam-spot is moved in an orbital fashion around the target surface,
    whereby target wear is distributed in an orbit around the target surface.

13. The sputtering system of claim 12 wherein the moving table is either an X-Y table with a first slider for sliding the target along a first axis and a second slider for sliding the target along a second axis to produce the orbital motion along two axis of motion, or the moving table comprises a rotating gear within a gear ring.

14. The sputtering system of claim 12 wherein the wear-distributing motor is mounted on the target mount within the chamber.

15. The sputtering system of claim 13 further comprising:

a first shaft, rotated by the wear-distributing motor;

a center shaft, linked to the first shaft, the center shaft rotating along an axis having the orbital center;

an arm, attached to the center shaft and extending to the center of the target, for orbiting the center of the target around the center shaft as the center shaft is rotated by the first shaft; and interlocking gears for linking the first shaft to the center shaft, the interlocking gears for changing an axis of rotation of the first shaft to a different axis of rotation of the center shaft.

16. The sputtering system of claim 15 wherein the X-Y table comprises a plurality of plates, parallel to the target, the plurality of plates coupled together by the first and second sliders that allow movement of the plurality of plates relative to each other when impelled by the arm.

17. The sputtering system of claim 16 wherein the target mount has at least three X-Y tables for mounting at least three targets, wherein each X-Y table has a center shaft that is coupled to an interlocking gear of the first shaft;

wherein the center shaft powers orbital movement of all targets on the target mount even though only one of the at least three targets is sputtered by the ion beam.

18. The sputtering system of claim 17 further comprising:

a selecting motor, activated when the ion beam source is disabled from applying the beam-spot to the target surface;

a select shaft for linking the selecting motor to the target mount, the select shaft rotating the target mount to move a different one of the targets into position to receive the beam-spot in response to activation of the selecting motor, whereby targets are selected by rotating the target mount.

19. The sputtering system of claim 18 wherein the wear-distributing motor is disabled when the selecting motor is activated before deposition, but the selecting motor is disabled when the wear-distributing motor is activated during deposition.

20. A target mount for holding a target for sputtering comprising:

base means for connecting the target to a target mount within a sputtering chamber, the base means being stationary with respect to an ion beam during deposition of target material onto a substrate in the sputtering chamber;

target mounting means for holding the target;

intermediate means, between the base means and the target mounting means, for separating the base means from the target mounting means;

first sliding means for sliding the intermediate means relative to the base means;

second sliding means for sliding the intermediate means relative to the target mounting means;

rotary means for rotating a center shaft; and arm means, coupled to the center shaft and to the target mounting means, for moving the target mounting means around the center shaft wherein a center of the target is moved in an orbit around the center shaft, whereby the target is moved in an orbit to reduce wear from the ion beam.

21. A sputtering system for distributing target wear comprising:

a chamber;

a substrate in the chamber;

a target containing atoms for deposition on a surface of the substrate;

an ion-beam source for generating an ion beam directed at the target in the chamber, the ion beam striking the target primarily in a beam-spot on a target surface of the target;

a target mount, inside the chamber, for holding at least one target, the target mount having an outer gear ring and an inner gear ring coupled together by gear teeth, for moving the target in an orbital motion wherein a center of the target is rotated about a that is offset from the center of the target; and a wear-distributing motor, coupled to the inner gear ring of the target mount, for powering the orbital motion of the target during deposition of material from the target on the substrate;

wherein the beam-spot is moved in an orbital fashion around the target surface.

* * * * *